United States Patent
Arora et al.

(10) Patent No.: US 9,416,447 B2
(45) Date of Patent: Aug. 16, 2016

(54) METHOD FOR LINE DENSITY MULTIPLICATION USING BLOCK COPOLYMERS AND SEQUENTIAL INFILTRATION SYNTHESIS

(71) Applicant: HGST Netherlands B.V., Amsterdam (NL)

(72) Inventors: Hitesh Arora, Fremont, CA (US); Ricardo Ruiz, Santa Clara, CA (US)

(73) Assignee: HGST Netherlands B.V., Amsterdam (NL)

( * ) Notice: Subject to any disclaimer, the term of this patent is extended or adjusted under 35 U.S.C. 154(b) by 281 days.

(21) Appl. No.: 14/174,939

(22) Filed: Feb. 7, 2014

(65) Prior Publication Data

US 2015/0225850 A1  Aug. 13, 2015

(51) Int. Cl.
| | |
|---|---|
| *C23C 16/22* | (2006.01) |
| *C23C 16/40* | (2006.01) |
| *C23C 16/455* | (2006.01) |
| *G03F 7/00* | (2006.01) |
| *H01L 21/027* | (2006.01) |
| *H01L 21/033* | (2006.01) |
| *H01L 21/308* | (2006.01) |

(52) U.S. Cl.
CPC ......... *C23C 16/45525* (2013.01); *C23C 16/402* (2013.01); *C23C 16/403* (2013.01); *C23C 16/405* (2013.01); *C23C 16/407* (2013.01); *G03F 7/0002* (2013.01); *H01L 21/0271* (2013.01); *H01L 21/0335* (2013.01); *H01L 21/3083* (2013.01)

(58) Field of Classification Search
CPC .................................................. G03F 7/0002
See application file for complete search history.

(56) References Cited

U.S. PATENT DOCUMENTS

| | | |
|---|---|---|
| 7,758,981 B2 | 7/2010 | Albrecht et al. |
| 7,976,715 B2 | 7/2011 | Dobisz et al. |

(Continued)

OTHER PUBLICATIONS

Peng et al., "A Route to Nanoscopic Materials via Sequential Infiltration Synthesis on Block Copolymer Templates", ACS Nano, vol. 5, No. 6, 4600-4606, 2011.

(Continued)

*Primary Examiner* — Ian Rummel
(74) *Attorney, Agent, or Firm* — Thomas R. Berthold

(57) ABSTRACT

Block copolymers (BCPs) and synthetic infiltration synthesis (SIS) are used to double the line density on a substrate. The BCP comprises first and second interconnected BCP components with a functional group at the junction or interface of the components. After deposition of the BCP on the substrate and annealing, a pattern of parallel stripes of first and second BCP components is formed with a pattern of functional group interfaces between the components. Each of the BCP components is non-reactive with atomic layer deposition (ALD) precursors, while the functional group is reactive with the ALD precursors. The ALD results in the infiltration of inorganic material into the interfaces where the reactive functional groups are located but without affecting the BCP components. After removal of the organic material, a pattern of parallel lines of inorganic material remains with a pitch half that of the stripes of BCP components.

11 Claims, 5 Drawing Sheets

(56) References Cited

U.S. PATENT DOCUMENTS

| | | |
|---|---|---|
| 8,059,350 B2 | 11/2011 | Albrecht et al. |
| 8,119,017 B2 | 2/2012 | Albrecht et al. |
| 8,283,253 B2 | 10/2012 | Yaegashi |
| 8,455,364 B2 | 6/2013 | Kanakasabapathy |
| 2008/0299776 A1 | 12/2008 | Bencher et al. |
| 2012/0046421 A1* | 2/2012 | Darling .................. C08F 8/42 525/371 |
| 2012/0241411 A1 | 9/2012 | Darling et al. |

OTHER PUBLICATIONS

George, "Atomic Layer Deposition: An Overview", Chemical Review, 2010, vol. 110, No. 1, 111-131.

Ruiz, et al., "Image Quality and Pattern Transfer in Directed Self Assembly with Block-Selective Atomic Layer Deposition", Journal of Vacuum Science & Technology B: Microelectronics and Nanometer Structures, 2012, 30, (6).

Tseng et al., "Enhanced Block Copolymer Lithography Using Sequential Infiltration Synthesis", J. Phys. Chem. C, 2011, 115(36), pp. 17725-17729.

* cited by examiner

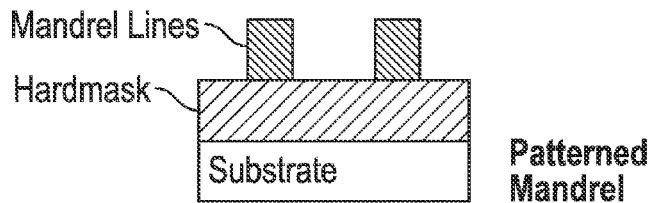
FIG. 1A (Prior Art) Patterned Mandrel
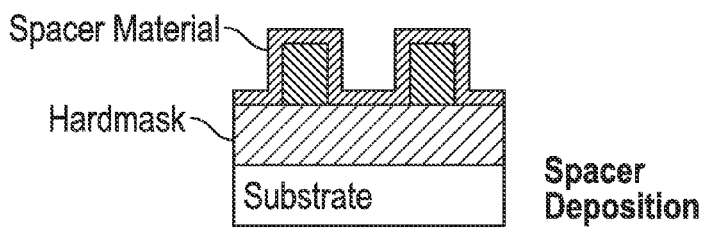
FIG. 1B (Prior Art) Spacer Deposition
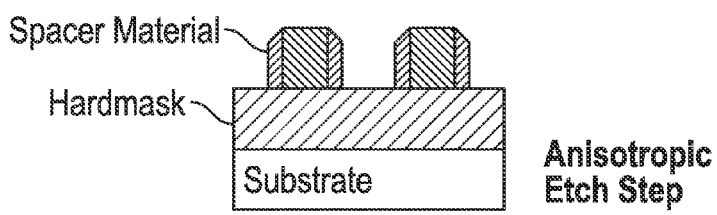
FIG. 1C (Prior Art) Anisotropic Etch Step
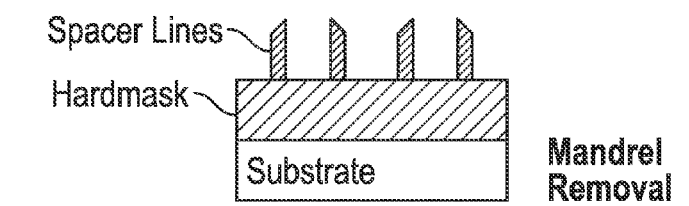
FIG. 1D (Prior Art) Mandrel Removal
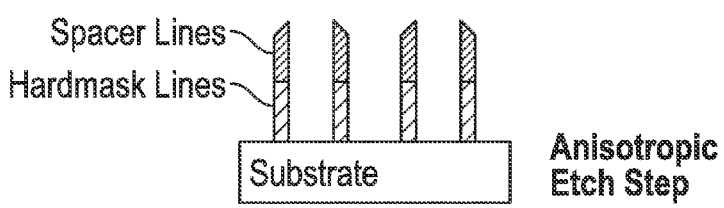
FIG. 1E (Prior Art) Anisotropic Etch Step
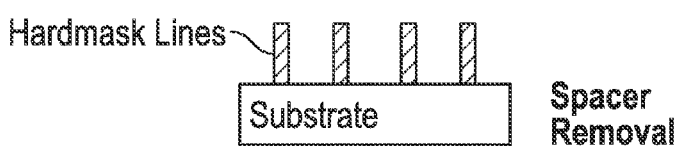
FIG. 1F (Prior Art) Spacer Removal

METHOD FOR LINE DENSITY MULTIPLICATION USING BLOCK COPOLYMERS AND SEQUENTIAL INFILTRATION SYNTHESIS

BACKGROUND OF THE INVENTION

1. Field of the Invention

This invention relates to line density multiplication in the area of nanotechnology, such as the fabrication of semiconductor devices and nanoimprint templates.

2. Description of the Related Art

Current photolithography has reached fundamental printing limits. As a result, it is necessary to develop processes for line density multiplication. One process that is gaining recognition for use in DRAM and NAND flash manufacturing is sidewall spacer "line doubling", sometimes also referred to as "line multiplication", "frequency doubling", "self-aligned double patterning (SADP)", "sidewall image transfer" or "pitch-halving". The process also has application in making imprint templates, which may be used for making bit-patterned-media (BPM) magnetic recording disks. For example, U.S. Pat. No. 7,758,981 B2, which is assigned to the same assignee as this application, describes a method using sidewall spacer line doubling to make an imprint template with generally radial lines.

The process uses sidewall spacers to create patterned hardmasks as a means of doubling the line density. The prior art process is illustrated in FIGS. 1A-1F. A layer of hardmask material is deposited on a substrate, and a layer of mandrel material (which may be a photoresist) is patterned into lines on the hardmask layer (FIG. 1A). A conformal layer of spacer material is deposited on the tops and sides of the mandrel lines and on the hardmask layer in the gaps between the mandrel lines (FIG. 1B). The spacer material is typically an inorganic material, typically oxides like $Al_2O_3$, and is typically formed by atomic layer deposition (ALD). ALD is a well-known thin film deposition process based on the sequential use of a gas phase chemical process, in which by repeatedly exposing gas phase chemicals known as the precursors to the growth surface and activating them at elevated temperature, a precisely controlled thin film is deposited in a conformal manner. The spacer material on the tops of the mandrel lines and in the gaps between the mandrel lines is then removed by anisotropic etching, leaving the mandrel lines with sidewalls of spacer material (FIG. 1C). The material of the mandrel lines is then removed, leaving lines of sidewall spacer material on the hardmask layer (FIG. 1D). The number of spacer lines in FIG. 1D is double the number of mandrel lines in FIG. 1A, and thus the pitch of the spacer lines is half the pitch of the mandrel lines, hence the terms "line doubling" and "pitch halving". The spacer lines are then used as an etch mask to transfer the pattern into the hardmask (FIG. 1E) and the spacer lines are then removed, leaving a pattern of hardmask lines on the substrate (FIG. 1E).

A problem with the prior art method of line density multiplication by the use of sidewall spacers is that the sidewall spacers formed on the mandrel stripes are used as the final etch mask to etch the substrate. However, the mandrel stripes are often not precisely perpendicular to the substrate, resulting in tilted sidewall spacers and degraded etched substrates.

What is needed is a line doubling process that does not require mandrel stripes and sidewall spacers.

SUMMARY OF THE INVENTION

In embodiments of this invention block copolymers (BCPs) and synthetic infiltration synthesis (SIS) are used to halve the pitch and thus double the line density on a substrate. The BCP comprises first and second interconnected BCP components with a functional group at the junction or interface of the components. After deposition of the BCP on the substrate and annealing, a pattern of parallel stripes of first and second BCP components is formed with a pattern of interfaces between the components that contains the functional groups. The structure is then placed in an atomic layer deposition (ALD) chamber. Each of the BCP components is non-reactive with the ALD precursors, while the functional group is reactive with the ALD precursors. The ALD results in the infiltration of inorganic material, e.g., alumina, into the interfaces where the reactive functional groups are located but without affecting the BCP components. The organic material of the BCP components and functional groups is removed, leaving a pattern of parallel lines of inorganic material with a pitch half that of the stripes of BCP components. The inorganic lines can then be used as an etch mask to etch the underlying substrate. The etched substrate can be used as a nanoimprint template.

For a fuller understanding of the nature and advantages of the present invention, reference should be made to the following detailed description taken together with the accompanying figures.

BRIEF DESCRIPTION OF THE DRAWING

FIGS. 1A-1F are sectional views illustrating the general concept of sidewall spacer line doubling according to the prior art.

DETAILED DESCRIPTION OF THE INVENTION

Figure 2A:
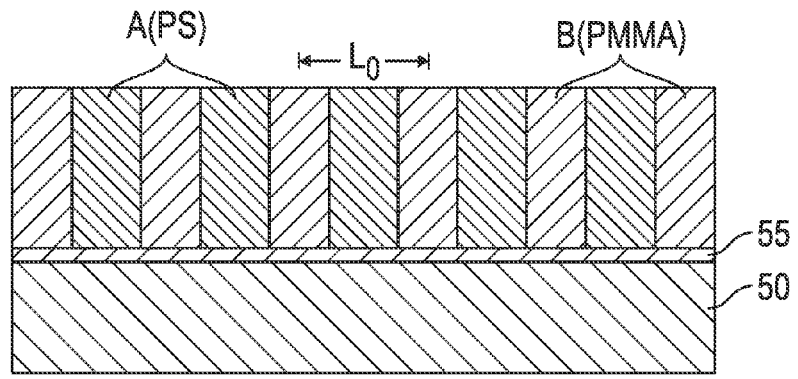
FIGS. 2A-2F are side sectional views illustrating the prior art method using sequential infiltration synthesis (SIS) and a block copolymer (BCP) film for making an etched structure with a line density equal to that of the density of the BCP periodic pattern.

Self-assembling block copolymers (BCPs) have been proposed for creating periodic nanometer (nm) scale features. Self-assembling BCPs typically contain two or more different polymeric block components, for example components A and B, that are immiscible with one another. Under suitable conditions, the two or more immiscible polymeric block components separate into two or more different phases or microdomains on a nanometer scale and thereby form ordered patterns of isolated nano-sized structural units. There are many types of BCPs that can be used for forming the self-assembled periodic patterns. If one of the components A or B is selectively removable without having to remove the other, then an orderly arranged structural units of the un-removed component can be formed.

Specific examples of suitable BCPs that can be used for forming the self-assembled periodic patterns include, but are not limited to: poly(styrene-block-methyl methacrylate) (PS-b-PMMA), poly(ethylene oxide-block-isoprene) (PEO-b-PI), poly(ethylene oxide-block-butadiene) (PEO-b-PBD), poly(ethylene oxide-block-styrene) (PEO-b-PS), poly(ethylene oxide-block-methylmethacrylate) (PEO-b-PMMA), poly(ethyleneoxide-block-ethylethylene) (PEO-b-PEE), poly(styrene-block-vinylpyridine) (PS-b-PVP), poly(styrene-block-isoprene) (PS-b-PI), poly(styrene-block-butadiene) (PS-b-PBD), poly(styrene-block-ferrocenyldimethylsilane) (PS-b-PFS), poly(butadiene-block-vinylpyridine) (PBD-b-PVP), poly(isoprene-block-methyl methacrylate) (PI-b-PMMA), poly(styrene-block-lactic acid) (PS-b-PLA) and poly(styrene-block-dymethylsiloxane) (PS-b-PDMS).

The specific self-assembled periodic patterns formed by the BCP are determined by the molecular volume ratio between the first and second polymeric block components A and B. When the ratio of the molecular volume of the second polymeric block component B over the molecular volume of the first polymeric block component A is less than about 80:20 but greater than about 60:40, the BCP will form an ordered array of cylinders composed of the first polymeric block component A in a matrix composed of the second polymeric block component B. When the ratio of the molecular volume of the first polymeric block component A over the molecular volume of the second polymeric block component B is less than about 60:40 but is greater than about 40:60, the BCP will form alternating lamellae composed of the first and second polymeric block components A and B. The un-removed component is used as an etch mask to etch the underlying template substrate. When the ratio of B over A is greater than about 80:20 the BCP will form an ordered array of spheres in a matrix of the second component. For lamellar or cylinder forming BCPs, the orientation of the lamellae or the cylinders with respect to the substrate depends on the interfacial energies (wetting properties) of the block copolymer components at both the substrate interface and at the top interface. When one of the block components preferentially wets the substrate (or the top free interface) the block copolymers form layers parallel to the substrate. When the wetting properties at the interface are neutral to either block, then both block components can be in contact with the interface, facilitating the formation of block copolymer domains with perpendicular orientation. In practice, the wetting properties of the substrate are engineered by coating the substrate with "surface modification layers" that tune the wetting properties at the interface. Surface modification layers are usually made of polymer brushes or mats typically (but not necessarily) composed of a mixture of the constituent block materials of the BCP to be used.

The periodicity or natural pitch ($L_0$) of the repeating structural units in the periodic pattern is determined by intrinsic polymeric properties such as the degree of polymerization N and the Flory-Huggins interaction parameter $\chi$. $L_0$ scales with the degree of polymerization N, which in turn correlates with the molecular weight M. Therefore, by adjusting the total molecular weight of the BCP, the natural pitch ($L_0$) of the repeating structural units can be selected.

To form the self-assembled periodic patterns, the BCP is first dissolved in a suitable solvent system to form a BCP solution, which is then applied onto a surface to form a thin BCP layer, followed by annealing of the thin BCP layer, which causes phase separation between the different polymeric block components contained in the BCP. The solvent system used for dissolving the BCP and forming the BCP solution may comprise any suitable non-polar solvent, including, but not limited to: toluene, propylene glycol monomethyl ether acetate (PGMEA), propylene glycol monomethyl ether (PGME), and acetone. The BCP solution can be applied to the substrate surface by any suitable techniques, including, but not limited to: spin casting, coating, spraying, ink coating, dip coating, etc. Preferably, the BCP solution is spin cast onto the substrate surface to form a thin BCP layer. After application of the thin BCP layer onto the substrate surface, the entire substrate is annealed to effectuate microphase segregation of the different block components contained by the BCP, thereby forming the periodic patterns with repeating structural units.

The BCP films in the above-described techniques self-assemble without any direction or guidance. This undirected self-assembly results in patterns with defects so it is not practical for applications that require long-range ordering, such as for making imprint templates. However, directed self-assembly (DSA) of block copolymers (BCPs) has been proposed for making imprint templates. DSA of BCPs by use of a patterned sublayer for the BCP film is well-known, as described for example in U.S. Pat. No. 7,976,715; U.S. Pat. No. 8,059,350; and U.S. Pat. No. 8,119,017. Pending application Ser. No. 13/627,492, filed Sep. 26, 2012 and assigned to the same assignee as this application, describes the use DSA of BCPs to make two submaster imprint templates, one with a pattern of generally radial lines, and the other with generally concentric rings, to make a master imprint template, which is then used to imprint patterned-media magnetic recording disks. Imprint templates made with DSA of BCPs have also been proposed for use in semiconductor manufacturing, for example, for patterning parallel generally straight lines in MPU, DRAM and NAND flash devices.

More recently a method termed "sequential infiltration synthesis" (SIS) uses BCP films and atomic layer deposition (ALD) to selectively grow nanometer scale patterns of inorganic material inside BCP films. (See Peng et al., "A Route to Nanoscopic Materials via Sequential Infiltration Synthesis on Block Copolymer Templates", ACS Nano, VOL. 5, NO. 6, 4600-4606, 2011). The prior art method for making an imprint template using DSA of BCPs and SIS will be described in general terms with FIGS. 2A-2F for an example where the substrate will become an imprint template with protrusions in a pattern of parallel bars. FIG. 2A is a side sectional view showing a patterned sublayer 55 on the surface of template 50. A BCP film is deposited on the patterned sublayer 55 and annealed to form the self-assembled pattern of alternating A component (polystyrene-PS) parallel stripes and B component (PMMA) parallel stripes. The sublayer 55 has been patterned to direct the self-assembly of the stripes of A and B BCP components with a natural pitch of $L_0$.

Figure 2B:
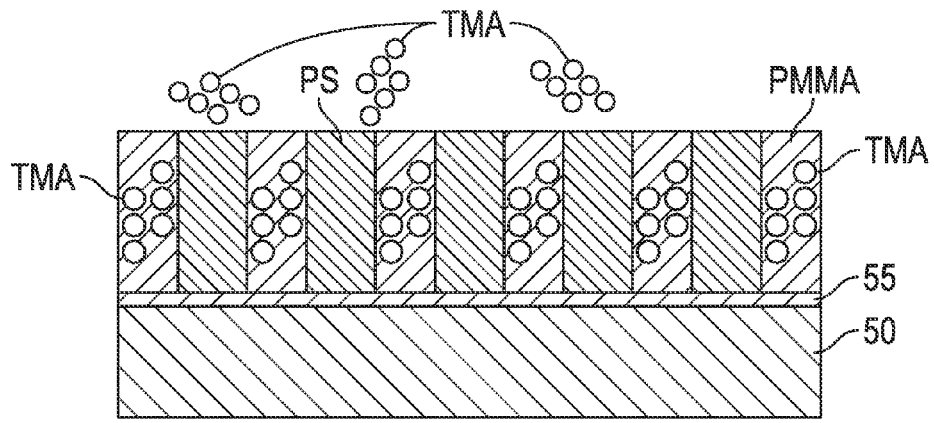
Figure 2C:
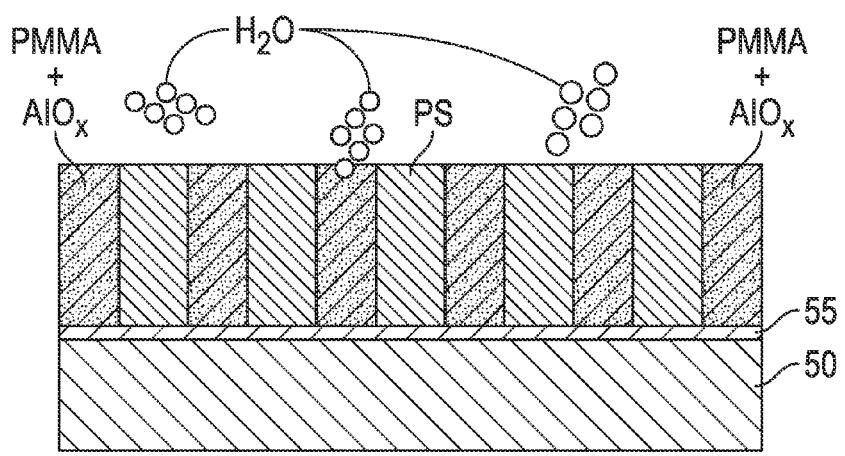
Figure 2D:
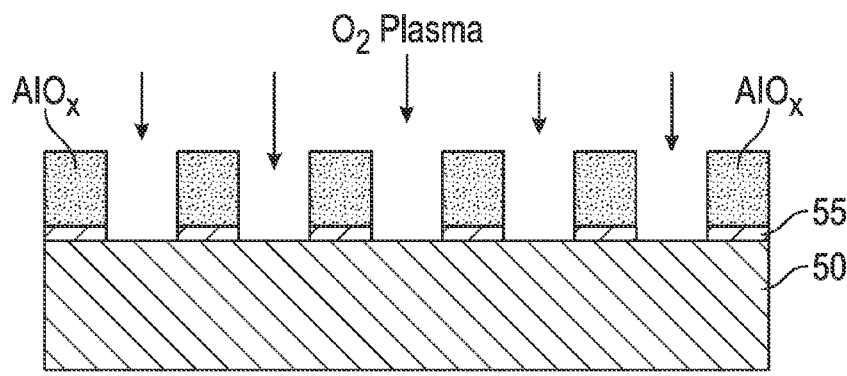
Figure 2E:
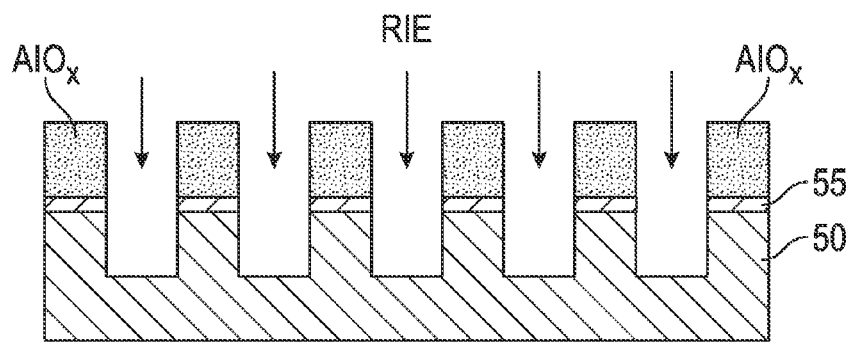
Figure 2F:
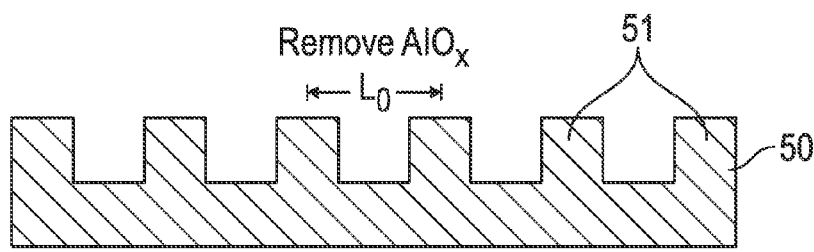

The sample is then placed in an ALD chamber, such as those available from Cambridge Nanotech Inc. of Cambridge, Mass. ALD is known as a process for forming very thin films on a substrate. ALD involves deposition of gas phase precursor molecules. Most ALD processes are based on binary reaction sequences where two surface reactions occur and deposit a binary compound film, such as the use of trimethylaluminum (TMA) and $H_2O$ to form alumina ($Al_2O_3$). An overview of ALD is presented by George, "Atomic Layer Deposition: An Overview", Chemical Review, 2010, Vol. 110, No. 1, 111-131. In SIS, the BCP has been chosen so that one component, for example PS, is inert to the ALD precursors while the other component, PMMA, reacts with the precursor. A first precursor, for example TMA, is introduced into the ALD chamber (FIG. 2B). PMMA contains carbonyl groups that react with the TMA, causing the TMA to infiltrate the PMMA. The controlled interaction of TMA with carbonyl groups in the PMMA generates Al—$CH_3$/Al—OH sites inside the PMMA. A second precursor, for example water vapor, is then introduced to finish the reaction, forming alumina in the locations in the PMMA where the TMA attached (FIG. 2C). The processes may be repeated a number of cycles to increase the amount of infiltrated alumina. For lithographic applications, the PS component, which is inert to the ALD precursors, the sublayer material beneath the PS, and the PMMA material is then removed by oxygen plasma to leave a pattern that mimics the original pattern of PS and PMMA but that is now made of the alumina synthesized by the ALD precursors (FIG. 2D). This pattern of alumina can then be used as an etch mask to reactively ion etch (RIE) the template 50 (FIG. 2E), after which the alumina and any remaining sublayer material is removed, leaving the etched template (FIG. 2F) with protrusions 51 of parallel bars having a pitch $L_0$.

As is apparent from FIGS. 2A-2F, the prior art process results in an etched substrate with features or lines (protrusions 51) that have the same pitch as the natural pitch ($L_0$) of the repeating structural units of one of the BCPs. In embodiments of this invention BCPs and SIS are used to halve the pitch and thus double the line density. The BCP used in embodiments of this invention comprises first and second interconnected BCP components with a functional group at the junction or interface of the components. After deposition of the BCP on the substrate and annealing, a pattern of parallel stripes of first and second BCP components is formed with a pattern of interfaces between the components that contains the functional groups. Each of the BCP components is non-reactive with the ALD precursor, while the functional group is reactive with the ALD precursor. The ALD results in the infiltration of inorganic material, e.g., alumina, into the interfaces where the reactive functional groups are located but without affecting the BCP components. The organic material of the BCP components and functional groups is removed, leaving a pattern of parallel lines of inorganic material with a pitch half that of the stripes of BCP components. The inorganic lines can then be used as an etch mask to etch the underlying substrate.

Figure 3A:
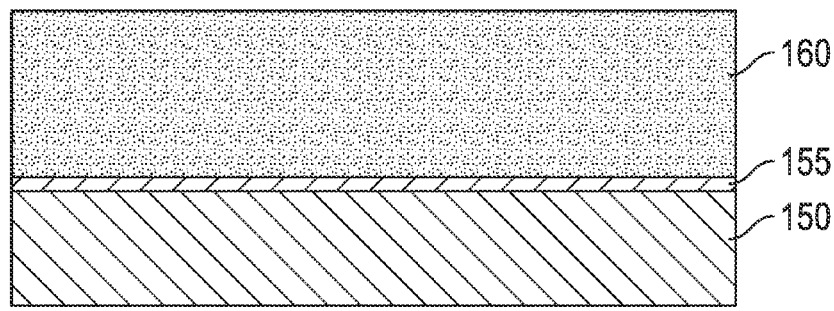
FIGS. 3A-3F are side sectional views illustrating an embodiment of the method of this invention using BCPs and SIS for making an etched structure with line density that is a multiple of the density of the BCP periodic pattern.

FIGS. 3A-3F illustrate an embodiment of the method of the invention. FIG. 3A is a cross-sectional view of a substrate 150 with a patterned sublayer 155 and a layer 160 of the BCP that has been deposited on the patterned sublayer 155, but not yet annealed. The BCP material in layer 160 comprises two polymer components A and B, each of which is non-reactive with the precursors used for the inorganic material that will be deposited by ALD, and a functional group at the junction of the A and B components. The BCP molecule may have the form A-b-B, where "b" includes the functional group that reacts with the ALD precursors. Suitable polymers for the A and B components include, but are not limited to linear or branched chain polymers like polyisoprene (PI), polyethylene, polypropylene, polybutadiene and other derivatives; aromatics like polystyrene (PS), poly-methylstyrene; acrylonitrile butadiene styrene; polydimethylsiloxane (PDMS) and olyhedral oligomeric silsesquioxane (POSS). The functional groups at the junction of the A and B components include, but are not limited to, a carbonyl group, a carboxyl group, a thiol group and an amine group. In one example of a BCP molecule, the BCP copolymers may be PI and PS and the functional group a carbonyl group, as depicted below:

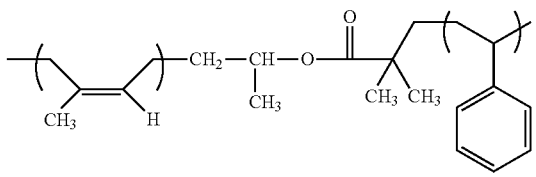

The functional groups are reactive with the precursors used for the inorganic material that will be deposited by ALD, which include, but are not limited to, oxides of aluminum, titanium, silicon (e.g., $SiO_2$), zinc (e.g., ZnO); and tungsten (W). The BCP material is dissolved in a suitable solvent and spin-coated on the sublayer 155 to form the layer 160. The thickness of BCP layer 160 is preferably between 0.8-1.5 $L_0$.

The substrate 150 may be formed of any suitable material, such as, but not limited to, single-crystal Si, amorphous Si, silica, fused quartz, silicon nitride, carbon, tantalum, molybdenum, chromium, alumina and sapphire. The sublayer 155 may be a nearly neutral layer of a material that does not show a strong wetting affinity by one of the polymer blocks over the other. The neutral layer can be, but is not restricted to, a functionalized polymer brush like carboxyl-terminated or hydroxyl-terminated brush, a cross-linkable polymer, a functionalized polymer "A" or "B" or a functionalized random copolymer "A-r-B". The functional group may be, for example, a hydroxyl (OH) group. The substrate has a silicon oxide surface film and the neutral layer could contain but is not limited to a hydroxyl-terminated poly(styrene-r-isoprene) brush containing ~67% styrene. Alternatively, the sublayer may be a material known as a polymer "mat" layer that shows strong wetting affinity by one of the polymer blocks over the other. The material of mat layer can be, but is not limited to, a cross-linkable polymer "A" or "B" like a crosslinkable polystyrene (XPS mat). The sublayer material may be spin-coated on the substrate to a thickness of about 1-10 nm. The sublayer is annealed for the end-groups to graft to the oxidized substrate surface in the case of an end-functionalized material or for the cross linking units to carry the cross-linking in the case of polymer "mats". After annealing, any ungrafted sublayer material is rinsed away in a suitable solvent (toluene, PGMA, NMP, etc). The purpose of the sublayer is to tune the surface energy adequately to promote the desired domain orientation (for example, perpendicular lamellae of the BCP components).

For DSA, additional steps are required to create a chemical pattern in the sublayer. These steps may include e-beam lithography, photolithography or nanoimprint lithography and potentially a combination of polymer mats and brushes. For example, a resist layer can be patterned by e-beam, followed by deposition of the sublayer material and removal of the resist. Alternatively, the chemical structure of exposed portions of a neutral sublayer can be chemically damaged or altered (by oxygen plasma etching or other process such as RIE, neutral atom (such as Ar) or molecule milling, ion bombardment and photodegradation) so that the exposed portions of the neutral sublayer have a preferred affinity (or repulsion) for one of the BCP components.

Figure 3B:
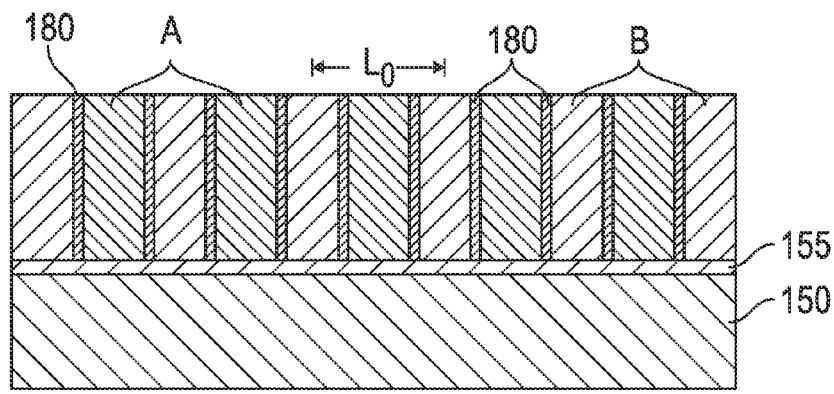

FIG. 3B shows the structure after annealing. The pattern of the sublayer 155 directs the A and B BCP components to self-assemble according to the pattern, with the functional groups at the interfaces 180 being formed between the A and B components. The BCP components may be chosen to form lamellae, cylinders or spheres with a characteristic center-to-center distance or "natural pitch" $L_0$ in the range of 5-50 nm. In the preferred embodiment, as shown in FIG. 3B, the A and B components are lamellae with perpendicular orientation of the lamellar domains relative to the substrate 150. The widths of the A and B components may be between about 5 and 50 nm. The width of the interfaces 180 depends on the choice of the interface functional group (i.e., its size and chemistry) and the choice of the block copolymer components, but would typically be in the range of about 0.5-3 nm. The resulting pattern in FIG. 3B thus includes interfaces 180 that are chemically prone to react with the ALD precursors and stripes of A and B components that are chemically inert to the ALD precursors.

Figure 3C:
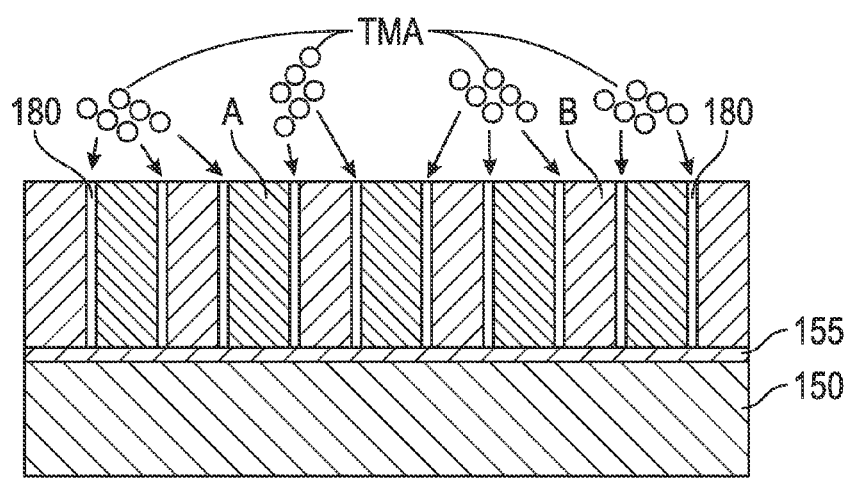
Figure 3D:
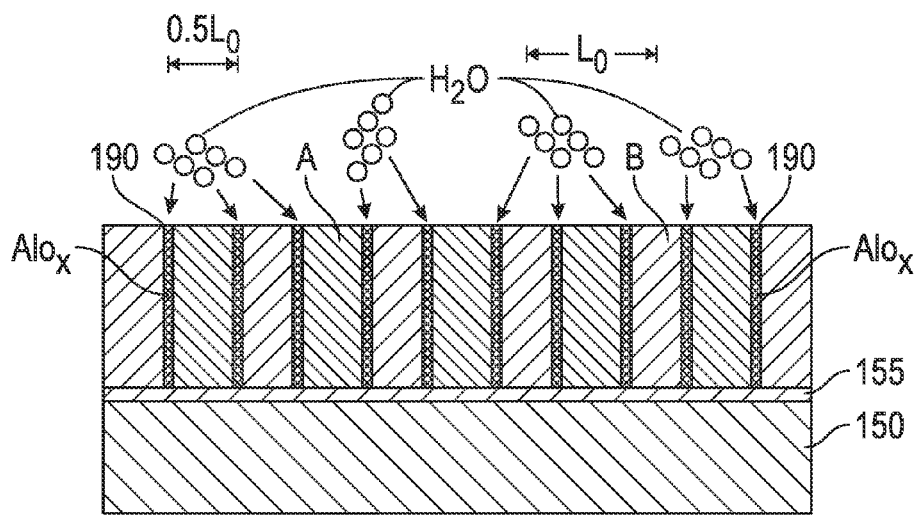

In FIGS. 3C and 3D the structure of FIG. 3B is placed in an ALD chamber and exposed to chemical precursors that react only with the material in the interfaces 180. For this example, it will be assumed that the A-b-B BCP material is PI-b-PS, where "b" includes a carbonyl group, and that the inorganic material to be formed is an aluminum oxide (AlOx), e.g., alumina ($Al_2O_3$). If the chemical precursors are a sequence of trimethyl aluminum (TMA) and water, the TMA will react with the carbonyl groups and become infused into the material in the interfaces, but will not react with the PI and PS (FIG. 3C). The second precursor, water, reacts with the TMA to form an aluminum oxide ($AlO_x$), which is predominately alumina, in the interfaces 180 (FIG. 3D). The ALD process can be repeated a number of cycles, typically more than 3, to form the desired amount of alumina in the interfaces 180. It is possible to first run the ALD tool in "static mode", also called "sequential infiltration synthesis" (SIS), to infuse the TMA inside the material in the interfaces 180, and then switch to conventional thermal ALD, wherein the substrate is heated, to increase the growth rate of the alumina in the interfaces. During the first SIS cycle a monolayer of alumina binds to the functional sites in the interfaces 180. Additional alumina is then deposited on top of the bound alumina during subsequent SIS cycles. This will allow "seeding" of growth at the interfaces 180 and controlling/growing the width of the alumina interfaces with subsequent SIS cycles. Growth of the alumina in the interfaces is accommodated by growth of the alumina in interstitial spaces around the A (PI) and B (PS) block copolymer chains as well as by swelling of the block copolymers. The number of cycles can be selected to assure the alumina interfaces have the desired thickness, typically at least 5 nm. Following the ALD, the structure is a pattern of alumina lines 190 at the interfaces between the PI and PS, with the alumina lines 190 having a pitch approximately half the pitch $L_0$ of the periodic pattern of PI and PS stripes, as depicted in FIG. 3D.

Figure 3E:
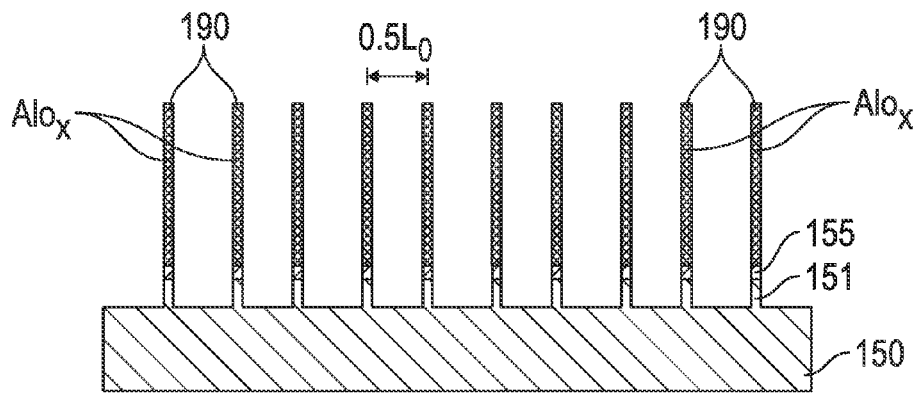
Figure 3F:
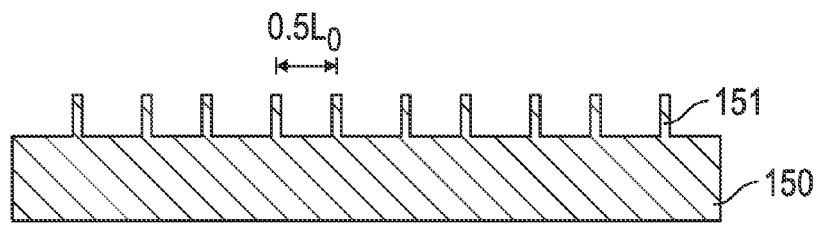

In FIG. 3E, reactive ion etching (RIE) is used to remove all the organic material (the PI, PS and any material in the interfaces) and etch into the substrate 150, using the alumina lines 190 as an etch mask. The substrate 150 then has a pattern of periodic protrusions 151. The RIE can be done in a plasma of $O_2$, $CO_2$ or $H_2$—Ar. The RIE also removes the sublayer 155 below the PI and PS. If the substrate 150 is a Si substrate, a fluorine etch can be used to etch features into the Si substrate. In FIG. 3F, the remaining alumina and underlying sublayer material is removed by RIE or a wet etch. Alternatively, the substrate 150 could have suitable transfer layers, like a hard mask, between the substrate and the alumina lines 190, to aid in transferring the pattern into the substrate. The resulting substrate with the etched pattern shown in FIG. 3F can be used as an imprint template, with the periodic pattern of protrusions 151 being a pattern of generally radial lines or generally concentric rings. Such imprint templates can be used to make a master imprint template, which is then used to imprint patterned-media magnetic recording disks. Imprint templates with the pattern of protrusions 151 being parallel generally straight lines can be used in making MPU, DRAM and NAND flash devices.

The ALD precursors are selected to infiltrate the inorganic material into the interfaces and to be non-reactive with the BCP components. In the examples above, the inorganic material is alumina and the precursors are TMA (which is reactive with carbonyl groups, carboxyl groups and amine groups) and water vapor. Other inorganic materials with suitable precursors may be formed by ALD. For example, if the inorganic material is to be a titanium oxide (TiOx), the precursors may be tetrakis(dimethylamido)titanium (TDMAT) and water vapor. Alternatively, other titanium containing precursors could be used in conjunction with water, such as titanium tetrachloride ($TiCl_4$) and titanium butoxide ($Ti(OBu)_4$). If the inorganic material is to be ZnO then the precursors may be diethyl zinc and water. If the inorganic material is to be $SiO_2$ then the precursors may be tris(tert-pentoxy)silanol and water. If the inorganic material is to be tungsten (W), then the precursors may be tungsten hexafluoride and disilane.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method using a block copolymer (BCP) for line density multiplication on a substrate comprising:
   providing a substrate;
   depositing on the substrate a sublayer for the BCP;
   patterning the sublayer;
   forming on the patterned sublayer a BCP, the BCP comprising first and second BCP components and a functional group at the interfaces of the first and second components, the BCP being directed by the patterned sublayer to self-assemble into said first and second components and interfaces of said functional group between said first and second components;
   placing the substrate with said self-assembled first and second components and said functional group interfaces in an atomic layer deposition (ALD) chamber;
   introducing into the ALD chamber a first precursor for an inorganic material, said first precursor being non-reactive with said first and second components and reactive with said functional group; and
   introducing into the ALD chamber a second precursor for said inorganic material, said second precursor being non-reactive with said first and second components and reactive with said first precursor to form said inorganic material in the interfaces between said first and second components; and
   wherein the first and second components self-assemble into a pattern of alternating first and second stripes with a natural pitch $L_0$, and wherein the inorganic material in the interfaces forms a pattern of lines having a pitch of approximately 0.5 $L_0$.

2. The method of claim 1 wherein said inorganic material is selected from an aluminum oxide, a titanium oxide, $SiO_2$, ZnO, and W.

3. The method of claim 1 wherein said first precursor is trimethylaluminum (TMA), said second precursor is water vapor, and said inorganic material is an aluminum oxide.

4. The method of claim 1 wherein the functional group is selected from a carboxyl group, a carbonyl group and an amine group.

5. The method of claim 1 wherein the first component is different from the second component and each of the first and second components is selected from polyisoprene (PI), polyethylene, polypropylene, polybutadiene, polystyrene (PS), poly-methylstyrene; acrylonitrile butadiene styrene, polydimethylsiloxane (PDMS) and olyhedral oligomeric silsesquioxane (POSS).

6. The method of claim 1 wherein the BCP comprises a copolymer of polystyrene (PS) and polyisoprene (PI) and a functional group selected from a carboxyl group, a carbonyl group, a thiol group and an amine group.

7. The method of claim 1 wherein the first and second components self-assemble as lamellae perpendicular to the substrate.

8. The method of claim 1 wherein introducing a first precursor and introducing a second precursor comprises at least three cycles of first and second precursor introduction.

9. The method of claim 1 wherein the first and second components are patterned into periodic alternating stripes, the stripe pattern being selected from generally radial lines, generally concentric rings, and parallel generally straight lines.

10. The method of claim 1 further comprising:
   after said inorganic material is formed in the interface, removing the first and second components and the functional group;
   etching the substrate, using said inorganic material as an etch mask; and
   thereafter removing said inorganic material and first component, leaving the etched substrate.

11. The method of claim 10 wherein removing the first and second components and the functional group comprises reactive ion etching (RIE).

\* \* \* \* \*